(12) United States Patent
Harris et al.

(10) Patent No.: US 8,563,348 B2
(45) Date of Patent: Oct. 22, 2013

(54) FABRICATION OF ELECTRICALLY ACTIVE FILMS BASED ON MULTIPLE LAYERS

(75) Inventors: James Harris, Manchester (GB); Nigel Pickett, East Croyden (GB)

(73) Assignee: Nanoco Technologies Ltd. (GB)

( * ) Notice: Subject to any disclaimer, the term of this patent is extended or adjusted under 35 U.S.C. 154(b) by 0 days.

(21) Appl. No.: 12/104,902

(22) Filed: Apr. 17, 2008

(65) Prior Publication Data

US 2008/0257201 A1 Oct. 23, 2008

Related U.S. Application Data (60) Provisional application No. 60/923,984, filed on Apr. 18, 2007, provisional application No. 60/991,510, filed on Nov. 30, 2007.

(51) Int. Cl.
*H01L 21/00* (2006.01)

(52) U.S. Cl.
USPC .............. 438/63; 977/712; 977/813; 977/932

(58) Field of Classification Search
USPC ........ 438/48, 57, 63; 977/701, 712, 720, 810, 977/813, 825, 932
See application file for complete search history.

(56) References Cited

U.S. PATENT DOCUMENTS

| | | |
|---|---|---|
| 2,769,838 A | 11/1956 | Matter et al. |
| 3,524,771 A | 8/1970 | Green |
| 4,609,689 A | 9/1986 | Schwartz et al. |
| 5,981,868 A * | 11/1999 | Kushiya et al. ............... 136/262 |
| 6,114,038 A | 9/2000 | Castro et al. |
| 6,207,229 B1 | 3/2001 | Bawendi et al. |
| 6,221,602 B1 | 4/2001 | Barbera-Guillem et al. |
| 6,261,779 B1 | 7/2001 | Barbera-Guillem et al. |
| 6,322,901 B1 | 11/2001 | Bawendi et al. |
| 6,326,144 B1 | 12/2001 | Bawendi et al. |
| 6,333,110 B1 | 12/2001 | Barbera-Guillem |
| 6,379,635 B2 | 4/2002 | O'Brien et al. |
| 6,423,551 B1 | 7/2002 | Weiss et al. |
| 6,426,513 B1 | 7/2002 | Bawendi et al. |
| 6,607,829 B1 | 8/2003 | Bawendi et al. |
| 6,660,379 B1 | 12/2003 | Lakowicz et al. |
| 6,699,723 B1 | 3/2004 | Weiss et al. |

(Continued)

FOREIGN PATENT DOCUMENTS

| | | |
|---|---|---|
| CN | 1394599 | 2/2003 |
| EP | 1176646 | 1/2002 |

(Continued)

OTHER PUBLICATIONS

"Conversion of Light to Electricity by $cis$-$X_2$Bis(2,2'-bipyridyl-4,4'-dicarboxylate)ruthenium(II) Charge-Transfer Sensitizers ($X=Cl^-$, $Br^-$, $I^-$, $CN9^-$, and $SCN^-$) on Nanocrystalline $TiO_2$ Electrodes," by M.K. Nazeeruddin, et al, *J. Am. Chem. Soc.* 1993, 115, 6382-6390.

(Continued)

*Primary Examiner* — Calvin Choi
(74) *Attorney, Agent, or Firm* — Wong, Cabello, Lutsch, Rutherford & Brucculeri LLP (57) ABSTRACT

A continuous film of desired electrical characteristics is obtained by successively printing and annealing two or more dispersions of prefabricated nanoparticles.

15 Claims, 4 Drawing Sheets

(56) References Cited

U.S. PATENT DOCUMENTS

| | | | |
|---|---|---|---|
| 6,815,064 B2 | 11/2004 | Treadway et al. | |
| 6,855,551 B2 | 2/2005 | Bawendi et al. | |
| 6,914,264 B2 | 7/2005 | Chen et al. | |
| 6,992,202 B1 | 1/2006 | Banger et al. | |
| 7,151,047 B2 | 12/2006 | Chan et al. | |
| 7,235,361 B2 | 6/2007 | Bawendi et al. | |
| 7,264,527 B2 | 9/2007 | Bawendi et al. | |
| 7,544,725 B2 | 6/2009 | Pickett et al. | |
| 7,588,828 B2 | 9/2009 | Mushtaq et al. | |
| 7,674,844 B2 | 3/2010 | Pickett et al. | |
| 7,803,423 B2 | 9/2010 | O'Brien et al. | |
| 7,867,556 B2 | 1/2011 | Pickett | |
| 7,867,557 B2 | 1/2011 | Pickett et al. | |
| 2003/0017264 A1 | 1/2003 | Treadway et al. | |
| 2003/0106488 A1 | 6/2003 | Huang et al. | |
| 2003/0148024 A1* | 8/2003 | Kodas et al. | 427/125 |
| 2004/0007169 A1 | 1/2004 | Ohtsu et al. | |
| 2004/0036130 A1 | 2/2004 | Lee et al. | |
| 2004/0063320 A1* | 4/2004 | Hollars | 438/689 |
| 2004/0110002 A1 | 6/2004 | Kim et al. | |
| 2004/0110347 A1 | 6/2004 | Yamashita | |
| 2004/0178390 A1 | 9/2004 | Whiteford et al. | |
| 2004/0250745 A1 | 12/2004 | Ogura et al. | |
| 2005/0098204 A1 | 5/2005 | Roscheisen et al. | |
| 2005/0129947 A1 | 6/2005 | Peng et al. | |
| 2005/0145853 A1 | 7/2005 | Sato et al. | |
| 2005/0183767 A1 | 8/2005 | Yu et al. | |
| 2006/0019098 A1 | 1/2006 | Chan et al. | |
| 2006/0057382 A1 | 3/2006 | Treadway et al. | |
| 2006/0061017 A1 | 3/2006 | Strouse et al. | |
| 2006/0068154 A1 | 3/2006 | Parce et al. | |
| 2006/0110279 A1 | 5/2006 | Han et al. | |
| 2006/0118757 A1 | 6/2006 | Klimov et al. | |
| 2006/0130741 A1 | 6/2006 | Peng et al. | |
| 2007/0012941 A1 | 1/2007 | Cheon | |
| 2007/0034833 A1 | 2/2007 | Parce et al. | |
| 2007/0059705 A1 | 3/2007 | Lu et al. | |
| 2007/0104865 A1 | 5/2007 | Pickett | |
| 2007/0110816 A1 | 5/2007 | Jun et al. | |
| 2007/0114520 A1 | 5/2007 | Garditz et al. | |
| 2007/0125983 A1 | 6/2007 | Treadway et al. | |
| 2007/0131905 A1 | 6/2007 | Sato et al. | |
| 2007/0199109 A1 | 8/2007 | Yi et al. | |
| 2007/0202333 A1 | 8/2007 | O'Brien et al. | |
| 2007/0238126 A1 | 10/2007 | Pickett et al. | |
| 2007/0289626 A1* | 12/2007 | Brabec et al. | 136/263 |
| 2008/0107911 A1 | 5/2008 | Liu et al. | |
| 2008/0112877 A1 | 5/2008 | Xiao et al. | |
| 2008/0121844 A1 | 5/2008 | Jang et al. | |
| 2008/0160306 A1 | 7/2008 | Mushtaq et al. | |
| 2008/0190483 A1* | 8/2008 | Carpenter et al. | 136/256 |
| 2008/0220593 A1 | 9/2008 | Pickett et al. | |
| 2008/0257201 A1 | 10/2008 | Harris et al. | |
| 2008/0264479 A1 | 10/2008 | Harris et al. | |
| 2009/0139574 A1 | 6/2009 | Pickett et al. | |
| 2009/0212258 A1 | 8/2009 | Mccairn et al. | |
| 2009/0263816 A1 | 10/2009 | Pickett et al. | |
| 2010/0059721 A1 | 3/2010 | Pickett et al. | |
| 2010/0068522 A1 | 3/2010 | Pickett et al. | |
| 2010/0113813 A1 | 5/2010 | Pickett et al. | |
| 2010/0123155 A1 | 5/2010 | Pickett et al. | |
| 2010/0193767 A1 | 8/2010 | Naasani et al. | |
| 2010/0212544 A1 | 8/2010 | Harris et al. | |

FOREIGN PATENT DOCUMENTS

| | | |
|---|---|---|
| EP | 1783137 | 5/2007 |
| EP | 1854792 | 11/2007 |
| GB | 2429838 | 3/2007 |
| GB | 195518910.6 | 3/2007 |
| JP | 2005-139389 | 6/2005 |
| WO | WO-97-10175 | 3/1997 |
| WO | WO-00-17642 | 3/2000 |
| WO | WO-02-04527 | 1/2002 |
| WO | WO-0224623 | 3/2002 |
| WO | WO-02-29140 | 4/2002 |
| WO | WO-03-099708 | 12/2003 |
| WO | WO-2004008550 | 1/2004 |
| WO | WO-2004-033366 | 4/2004 |
| WO | WO-2004-066361 | 8/2004 |
| WO | WO-2004065362 | 8/2004 |
| WO | WO-2005-021150 | 3/2005 |
| WO | WO-2005-106082 | 11/2005 |
| WO | WO-2005123575 | 12/2005 |
| WO | WO-2006001848 | 1/2006 |
| WO | WO-2006-017125 | 2/2006 |
| WO | WO-2006075974 | 7/2006 |
| WO | WO-2006/101986 | 9/2006 |
| WO | WO-2006-116337 | 11/2006 |
| WO | WO-2006118543 | 11/2006 |
| WO | WO-2006134599 | 12/2006 |
| WO | WO-2007020416 | 2/2007 |
| WO | WO-2007-049052 | 5/2007 |
| WO | WO-2007-060591 | 5/2007 |
| WO | WO-2007060591 | 5/2007 |
| WO | WO-2007/065039 | 6/2007 |
| WO | WO-2006/073437 | 7/2007 |
| WO | WO-2007098378 | 8/2007 |
| WO | WO-2007102799 | 9/2007 |
| WO | WO-2008013780 | 1/2008 |
| WO | WO-2008054874 | 5/2008 |
| WO | WO-2008133660 | 11/2008 |
| WO | WO-2009016354 | 2/2009 |
| WO | WO-2009040553 | 4/2009 |
| WO | WO-2009106810 | 9/2009 |

OTHER PUBLICATIONS

"Polymer Photovoltaic Cells: Enhanced Efficiencies via a Network of Internal Donor-Acceptor Heterojunctions," by G.Yu et al, *Science, New Series*, vol. 270, No. 5243 (Dec. 15, 1995) pp. 1789-1791.

"Engineering of Efficient Panchromatic Sensitizers for Nanocrystal-line $TiO_2$-Based Solar Cells," by Mohammad K. Nazeeruddin, et al, *J. Am. Chem. Soc.* 2001, 123, 1613-1624.

"CIS and CIGS layers from selenized nanoparticle precursors," by M. Kaelin et al, *Thin Solid Films* 431-432 (2003) 58-62.

"Non-Vacuum processing of $CuIn_{1-x}Ga_xSe_2$ solar cells on rigid and flexible substrates using nanoparticle precursor inks," by V. K. Kapur, et al *Thin Solid Films* 431-432 (2003) 53-57.

"Electroactive Surfactant Designed to Mediate Electron Transfer Between CdSe Nanocrystals and Organic Semiconductors," by Delia J. Milliron et al, *Adv. Mater.* 2003, 15, No. 1, Jan. 3.

"ZnO/ZnS(O,OH)/Cu(In,Ga)$Se_2$/Mo Solar Cell With 18:6% Efficiency," by M.A. Contreras, et al, *3rd World Conference on Photovoltaic Energy Conversion* May 11-18, 2003 Osaka, Japan.

"Highly Ordered $SnO_2$ Nanorod Arrays from Controlled Aqueous Growth," by Lionel Vayssieres, et al *Angew. Chem. Int. Ed.* 2004, 43, 3666-3670.

"Nanowire dye-sensitized solar cells," by Matt Law et al., *Nature Materials*, vol. 4, Jun. 2005.

"Air stable all-inorganic nanocrystal solar cells processed from solution," by Ilan Gur et al., Lawrence Berkeley National Laboratory, University of California, 2005, Paper LBNL-58424.

"Efficient polymer-nanocrystal quantum-dot photodetectors," by Difei Qi et al., *Applied Physics Letters* 86, 093103 (2005).

"Quantum Dot Solar Cells. Harvesting Light Energy with CdSe Nanocrystals Molecularly Linked to Mesoscopic $TiO_2$ Films," by Istvan Robel et al, JACS Articles, Jan. 31, 2006.

"Harvest of near infrared light in PbSe nanocrystal-polymer hybrid photovoltaic cells," by Cehu Cui et al., *Applied Physics Letters* 88, 183111 (2006).

Agger, J.R. et al., *J. Phys. Chem. B* (1998) 102, pp. 3345-3353.

Aldana, J. et al. "Photochemical Instability of CdSe Nanocrystals Coated by Hydrophilic Thiols", *J. Am. Chem. Soc.* (2001), 123: 8844-8850.

Alivisatos, A.P. "Perspectives on the Physical Chemistry of Semiconductor Nanocrystals", *J. Phys. Chem.*, (1996), 100, pp. 13226-13239.

Arici et al., *Thin Solid Films* 451-452 (2004) 612-618.

(56) References Cited

OTHER PUBLICATIONS

Battaglia et al., "Colloidal Two-dimensional Systems: CdSe Quantum Shells and Wells," *Angew Chem.* (2003) 42:5035-5039.
Bawendi, M.G. "The Quantum Mechanics of Larger Semiconductor Clusters ("Quantum Dots")", *Annu. Rev. Phys. Chem.* (1990), 42: 477-498.
Berry, C.R. "Structure and Optical Absorption of AgI Microcrystals", *Phys. Rev.* (1967) 161:848-851.
Bunge, S.D. et al. "Growth and morphology of cadmium chalcogenides: the synthesis of nanorods, tetrapods, and spheres from CdO and $Cd(O_2CCH_3)_2$," *J. Mater. Chem.* (2003) 13:1705-1709.
Castro et al., "Synthesis and Characterization of Colloidal $CuInS_2$ Nanoparticles from a Molecular Single-Source Precursors," *J. Phys. Chem. B* (2004) 108:12429.
Castro et al., *Chem. Mater.* (2003) 15:3142-3147.
Chun et al., *Thin Solid Films* 480-481 (2005) 46-49.
Cumberland et al., "Inorganic Clusters as Single-Source Precursors for Preparation of CdSe, ZnSe, and CdSe/ZnS Nanomaterials" *Chemistry of Materials*, 14, pp. 1576-1584 (2002).
Dance et al., *J. Am. Chem. Soc.* (1984) 106:6285-6295.
Daniels et al., "New Zinc and Cadmium Chalcogenide Structured Nanoparticles," *Mat. Res. Soc. Symp. Proc.* 789 (2004) pp. 31-36.
Eychmüller, A. et al. "A quantum dot quantum well: CdS/HgS/CdS", *Chem. Phys. Lett.* 208, pp. 59-62 (1993).
Fendler, J.H. et al. "The Colloid Chemical Approach to Nanostructured Materials", *Adv. Mater.* (1995) 7: 607-632.
Gao, M. et al. "Synthesis of PbS Nanoparticles in Polymer Matrices", *J. Chem. Soc. Commun.* (1994) pp. 2779-2780.
Gou et al., *J. Am. Chem. Soc.* (2006) 128:7222-7229.
Gurin, *Colloids Surf. A* (1998) 142:35-40.
Guzelian, A. et al. "Colloidal chemical synthesis and characterization of InAs nanocrystal quantum dots", *Appl. Phys. Lett.* (1996) 69: 1432-1434.
Guzelian, A. et al., "Synthesis of Size-Selected, Surface-Passivated InP Nanocrystals", *J. Phys. Chem.* (1996) 100: 7212-7219.
Hagfeldt, A. et al. "Light-induced Redox Reactions in Nanocrystalline Systems" *Chem. Rev.* (1995) 95: 49-68.
Henglein, A. "Small-Particle Research: Physicochemical Properties of Extremely Small Colloidal Metal and Semiconductor Particles", *Chem Rev.* (1989) 89: 1861-1873.
Hirpo et al., "Synthesis of Mixed Copper-Indium Chalcogenolates. Single-Source Precursors for the Photovoltaic Materials $CuInQ_2$ (Q=S, Se)," *J. Am. Chem. Soc.* (1993) 115:1597.
Hu et al., "Hydrothermal preparation of $CuGaS_2$ crystallites with different morphologies", *Sol. State Comm.* (2002) 121:493-496.
International Search Report for PCT/GB2005/001611 mailed Sep. 8, 2005 (5 pages).
Jegier, J.A. et al. "Poly(imidogallane): Synthesis of a Crystalline 2-D Network Solid and Its Pyrolysis to Form Nanocrystalline Gallium Nitride in Supercritical Ammonia", *Chem. Mater.* (1998) 10: 2041-2043.
Jiang et al., *Inorg. Chem.* (2000) 39:2964-2965.
Kher, S. et al. "A Straightforward, New Method for the Synthesis of Nanocrystalline GaAs and GaP", *Chem. Mater.* (1994) 6: 2056-2062.
Kim et al., "Synthesis of $CuInGaSe_2$ Nanoparticles by Low Temperature Colloidal Route", *J. Mech. Sci. Tech.* (2005) 19: 2085-2090.
Li et al., *Adv. Mat.* (1999) 11:1456-1459.
Lieber, C. et al. "Understanding and Manipulating Inorganic Materials with Scanning Probe Microscopes", *Angew. Chem. Int. Ed. Engl.* (1996) 35: 687-704.
Little et al., "Formation of Quantum-dot quantum-well heteronanostructures with large lattice mismatch: Zn/CdS/ZnS," 114 *J. Chem. Phys.* 4 (2001).
Lu et al., *Inorg. Chem.* (2000) 39:1606-1607.
LÅver, T. et al. "Preparation of a novel CdS nanocluster material from a thiophenolate-capped CdS cluster by chemical removal of SPh ligands", *J. Mater. Chem.* (1997) 7(4): 647-651.
Malik et al., *Adv. Mat.*, (1999) 11:1441-1444.

Matijevic, E. "Monodispersed Colloids: Art and Science", *Langmuir* (1986) 2:12-20.
Matijevic, E. "Production of Monodispersed Colloidal Particles", *Ann. Rev. Mater. Sci.* (1985) 15: 483-518.
Mekis, I. et al., "One-Pot Synthesis of Highly Luminescent CdSe/CdS Core-Shell Nanocrystals via Organometallic and "Greener" Chemical Approaches", J. Phys. Chem. B. (2003) 107:7454-7462.
Mews et al., *J. Phys. Chem.* (1994) 98:934-941.
Mićić et al., "Synthesis and Characterization of InP, GaP, and $GaInP_2$ Quantum Dots" *J. Phys. Chem.* (1995) pp. 7754-7759.
Murray, C.B. et al., "Synthesis and Characterization of Nearly Monodisperse CdE (E = S, Se, Te) Semiconductor Nanocrystallites", *J. Am. Chem. Soc.* (1993) 115 (19) pp. 8706-8715.
Nairn et al., *Nano Letters* (2006) 6:1218-1223.
O'Brien et al., "The Growth of Indium Selenide Thin Films from a Novel Asymmetric Dialkydiselenocarbamate," 3 *Chem. Vap. Depos.* 4, pp. 2227 (1979).
Olshaysky, M.A., et al. "Organometallic Synthesis of GaAs Crystallites Exhibiting Quantum Confinement", *J. Am. Chem. Soc.* (1990) 112: 9438-9439.
Olson et al., *J. Phys. Chem. C.* (2007) 111:16640-16645).
Patent Act 1977 Search Report under Section 17 for Application No. GB0522027.2 dated Jan. 27, 2006.
Patent Act 1977 Search Report under Section 17 for Application No. GB0723539.3 dated Mar. 27, 2008.
Patents Act 1977: Search Report under Section 17 for Application No. GB 0606845.6 dated Sep. 14, 2006.
Patents Act 1977: Search Report under Section 17 for Application No. GB 0719075.4.
Patents Act 1977: Search Report under Section 17 for Application No. GB0409877.8 dated Oct. 7, 2004.
Patents Act 1977: Search Report under Section 17 for Application No. GB 0719073.9.
Peng et al. "Shape control of CdSe nanocrystals", *Nature*, (2000) vol. 404, No. 6773, pp. 59-61.
Peng et al., "Kinetics of II-VI and III-V Colloidal Semiconductor Nanocrystal Growth: "Focusing" os Size Distributions", *J. Am. Chem. Soc.*, (1998) 129: 5343-5344.
Peng et al., "Mechanisms of the Shape Evolution of CdSe Nanocrystals", *J. Am. Chem. Soc.* (2001) 123:1389-1395.
Pradhan, N. et al. "Single-Precursor, One-Pot Versatile Synthesis under near Ambient Conditions of Tunable, Single and Dual Band Flourescing Metal Sulfide Nanoparticles", *J. Am. Chem. Soc.* (2003) 125: 2050-2051.
Qu, L. et al. "Alternative Routes toward High Quality CdSe Nanocrystals", *Nano Lett.* (2001) vol. 1, No. 6, pp. 333-337.
Salata, O.V. et al., *Appl. Phys. Letters* (1994) 65 (2) pp. 189-191.
Sercel, P.C. et al. "Nanometer-scale GaAs clusters from organometallic precursors", *Appl. Phys. Letters* (1992) 61: 696-698.
Steigerwald, M.L. et al. "Semiconductor Crystallites: A Class of Large Molecules." *Acc. Chem. Res.* (1990) 23: 183-188.
Stroscio, J.A. et al. "Atomic and Molecular Manipulation with the Scanning Tunneling Microscope", *Science* (1991), 254: 1319-1326.
Trinidade et al., "A single source approach to the synthesis of CdSe nanocrystallites", *Advanced Materials*, (1996) vol. 8, No. 2, pp. 161-163.
Wang Y. et al. "PbS in polymers. From molecules to bulk solids", *J. Chem. Phys.* (1987) 87: 7315-7322.
Weller, H. "Colloidal Semiconductor Q-Particles: Chemistry in the Transition Region Between Solid State and Molecules", *Angew. Chem. Int. Ed. Engl.* (1993) 32: 41-53.
Weller, H. "Quantized Semiconductor Particles: A Novel State of Matter for Materials Science", *Adv. Mater.* (1993) 5: 88-95.
Wells, R.L. et al. "Synthesis of Nanocrystalline Indium Arsenide and Indium Phosphide from Indium(III) Halides and Tris(trimethylsilyl)pnicogens. Synthesis, Characterization, and Decomposition Behavior of I3In-P(SiMe$_3$)3" *Chem. Mater.* (1995) 7: 793-800.
Xiao et al., *J. Mater. Chem.* (2001) 11:1417-1420.
Yang et al., *Crystal Growth & Design* (2007) 12/2562.
Zhong et al., "A facile route to synthesize chalcopyrite $CuInSe_2$ nanocrystals in non-coordinating solvent", *Nanotechnology* 18 (2007) 025602.

(56) References Cited

OTHER PUBLICATIONS

Barron, "Group III Materials: New Phases and Nono-particles with Applications in Electronics and Optoelectronics," Office of Naval Research Final Report (1999).
Dabousi et al., "(CdSe)ZnS Core—Shell Quantum Dots: Synthesis and Characterization of a Size Series of Highly Luminescent Nanocrystallites," Jrl. Phys. Chem.,(1997) 101, pp. 9463-9475.
Dehnen et al., "Chalcogen-Bridged Copper Clusters," Eur. J. Inorg. Chem., (2002) pp. 279-317.
Eisenmann et al., "New Phosphido-bridged Multinuclear Complexes of Ag and Zn," Zeitschrift fur anorganische and allgemeine Chemi (1995). (1 page—abstract).
Müller et al., "From Giant Molecular Clusters and Precursors to Solid-state Structures," Current Opinion in Solid State and Materials Science, 4 (Apr. 1999) pp. 141-153.
Shulz et al., J. Elect. Mat. (1998) 27:433-437.
Timoshkin, "Group 13 imido metallanes and their heavier analogs [RMYR'](M=Al, Ga, In; Y=N, P, As, Sb)," Coordination Chemistry Reviews (2005).
Vittal, "The chemistry of inorganic and organometallic compounds with adameantane-like structures," Polyhedron, vol. 15, No. 10, pp. 1585-1642 (1996).
Zhong et al, "Composition-Tunable ZnxCu1-xSe Nanocrytals with High Luminescence and Stability", Jrl Amer. Chem. Soc. (2003).
International Search Report for PCT/GB2006/003028 mailed Jan. 22, 2007 (5 pages).
Nielsch et al., "Uniform Nickel Deposition into Ordered Alumina Pores by Pulsed Electrodeposition", Advanced Materials, 2000 vol. 12, No. 8, pp. 582-586.
Huang et al., "Bio-Inspired Fabrication of Antireflection Nanostructures by Replicating Fly Eyes", Nanotechnology (2008) vol. 19.
Materials Research Society Symposium Proceedings Quantum Dots, Nanoparticles and Nanowires, 2004, ISSN: 0272-9172.
Xie et. al., "Synthesis and Characterization of Highly Luminescent CdSe-Core CdS/Zn0.5Cd0.5S/ZnS Multishell Nanocrystals," JACS Articles published on web Apr. 29, 2005.
Kim et. al., "Engineering InAsxP1-x/InP/ZnSe III-V Alloyed Core-Shell Quantum Dots for the Near-Infrared," JACS Articles published on web Jul. 8, 2005.
Rao et. al. "The Chemistry of Nanomaterials: Synthesis, Properties and Applications" (2004).
Trinidade et al., "Nanocrystalline Seminconductors: Synthesis, Properties, and Perspectives", Chemistry of Materials, (2001) vol. 13, No. 11, pp. 3843-3858.
International Search Report for PCT/GB2009/001928 mailed Dec. 8, 2009 (3 pages).
International Search Report for PCT/GB2009/002605 mailed Feb. 22, 2010 (3 pages).
Search Report for GB0813273.0 searched Dec. 8, 2008 (1 page).
Search Report for GB0814458.6 searched Dec. 5, 2008 (2 pages).
Search Report for GB0820101.4 searched Mar. 3, 2009 (1 page).
Search Report for GB0821122.9 searched Mar. 19, 2009 (2 pages).
Foneberov et al., "Photoluminescence of tetrahedral quantum-dot quantum wells" Physica E, 26:63-66 (2005).
Cao, "Effect of Layer Thickness on the Luminescence Properties of ZnS/CdS/ZnS quantum dot quantum well", J. of Colloid and Interface Science 284:516-520 (2005).
Harrison et al. "Wet Chemical Synthesis on Spectroscopic Study of CdHgTe Nanocrystals with Strong Near-Infrared Luminescence" Mat. Sci and Eng.B69-70:355-360 (2000).
Sheng et al. "In-Situ Encapsulation of Quantum Dots into Polymer Microsphers", Langmuir 22(8):3782-3790 (2006).
W. Peter Wuelfing et al., "Supporting Information for Nanometer Gold Clusters Protected by Surface Bound Monolayers of Thiolated Poly (ethylene glycol) Polymer Electrolyte" Journal of the American Chemical Society (XP002529160).
International Search Report for PCT/GB2009/000510 mailed Jul. 6, 2010 (16 pages).
International Search Report for PCT/GB2008/003958 mailed Sep. 4, 2009 (3 pages).
Banger et al., "Ternary single-source precursors for polycrystalline thin-film solar cells" Applied Organometallic Chemistry, 16:617-627, XP002525473 Scheme 1 Chemical Synthesis (2002).
D Qi, M Fischbein, M Drndic, S. Selmic, "Efficient polymer-nanocrystal quantum-dot photodetectors", Appl. Phys. Lett., 2004, 84, 4295.
Shen et al., "Photoacoustic and photoelectrochemical characterization of CdSe-sensitized Ti02 electrodes composed of nanotubes and nanowires" Thin Solid Films, Elsevier-Sequoia S.A. Lausanne, CH vol. 499, No. 1-2, Mar. 21, 2006, pp. 299-305, XP005272241 ISSN: 0040-6090.
Smestad GP, et al., "A technique to compare polythiophene solid-state dye sensitized Ti02 solar cells to liquid junction devices" Solar Energy Materials and Solar Cells, Elsevier Science Publishers, Amsterdam, NL, vol. 76, No. 1, Feb. 15, 2003, pp. 85-105, XP004400821 ISSN: 0927-0248.
Chen et al., "Electrochemically synthesized CdS nanoparticle-modified Ti02 nanotube-array photoelectrodes: Preparation, characterization, and application to photoelectrochemical cells" Journal of Photochemistry and Photobiology, a: Chemistry, Elsevier Sequoia Lausanne, CH, vol. 177, No. 2-3, Jan. 25, 2006, pp. 177-184, XP005239590 ISSN: 1010-6030.
Wang, et al., "In situ polymerization of amphiphilic diacetylene for hole transport in solid state dye-sensitized solar cells" Organic Electronics, El Sevier, Amsterdam NL, vol. 7, No. 6, Nov. 18, 2006, pp. 546-550, XP005773063 ISSN: 1566-1199.
International Search Report and Written Opinion for PCT/GB2008/001457 mailed Aug. 21, 2008 (14 pages).
Richardson et al., "Chemical Engineering: Chemical and Biochemical Reactors and Process Control," vol. 3, Third Edition, pp. 3-5 (1994).
Borchert et al., "High Resolution Photoemission STudy of CdSe and CdSe/ZnS Core-Shell Nanocrystals," Journal of Chemical Physics, vol. 119, No. 3, pp. 1800-1807 (2003).
Gaponik et al., "Thiol-Capping of CdTe Nanocrystals: An Alternative to Organometallic Synthetic Routes," Journal of Physical Chemistry B, vol. 106, No. 29, pp. 7177-7185 (2002).
Pickett et al., "Syntheses of Semiconductor Nanoparticles Using Single-Molecular Precursors," The Chemical Record, vol. 1 pp. 467-479 (2001).
International Search Report and Written Opinion for International Application No. PCT/GB2008/001349 mailed Nov. 18, 2008 (16 pages).

\* cited by examiner

FABRICATION OF ELECTRICALLY ACTIVE FILMS BASED ON MULTIPLE LAYERS

CROSS-REFERENCE TO RELATED APPLICATION

This application claims priority to and the benefits of U.S. Provisional Application Ser. Nos. 60/923,984, filed on Apr. 18, 2007, and 60/991,510, filed on Nov. 30, 2007, the entire disclosures of which are hereby incorporated by reference.

FIELD OF THE INVENTION

The present invention relates to thin-film materials, their fabrication, and devices made therefrom; and in particular to graded and multi-junction thin-film semiconductor structures.

BACKGROUND OF THE INVENTION

Thin-film technologies are currently being developed for the purpose of reducing the cost of semiconductor devices, in particular photovoltaic (PV) cells. Whereas conventional solar cells are made of slices of solid crystalline silicon wafers, which have thicknesses of typically a few hundred microns, thin-film materials can be directly deposited onto a substrate to form layers of ~2 μm or less, resulting in lower material as well as lower manufacturing costs. Moreover, thin-film technologies allow for monolithic integration, i.e. the in situ creation of electrical connections, which further reduces production costs.

Thin-film materials include cadmium-telluride (CdTe), copper indium diselenide (CIS) and variants thereof, amorphous silicon, and polycrystalline silicon (<50 μm). In recent years, technical progress has occurred particularly in thin-film technologies based on CdTe and CIS. Both materials have high absorptivities, so that most of the incident radiation can be absorbed within 1-2 μm of the film. Used as the absorber layer, in which incoming photons create electron-hole pairs, these materials can be paired with, for instance, a layer of CdS, to form heterojunctions, and sandwiched between front and back contacts to form a solar cell.

To gain widespread acceptance, thin-film PV cells must exhibit high conversion efficiencies of photon energy to electric current, and operate reliably in an outdoor environment over many years, ideally no less than 30 years. Technologies based on CdTe and CIS have demonstrated long-term stability; however, performance degradation has also been observed. Efficiencies of current thin-film devices reach 65% of the theoretical maximum (75% in the laboratory), still lagging behind some monocrystalline silicon and GaAs cells, which have demonstrated 90% of their ultimate achievable performance. Improvements in efficiency of thin-film technologies can be achieved through multijunctions and graded materials. For example, studies on CIS have revealed that doping with gallium, to form compounds referred to as CIGS and exhibiting gradients in the concentrations of Ga and In, lead to better efficiencies.

The complexities of thin-film technologies, which are essential for high efficiencies, adversely affect cost and manufacturability, establishing a need for improved techniques—in particular low-cost techniques amenable to practice with off-the-shelf equipment. Challenges to the development of low-cost and reliable CIGS and CdTe devices include the standardization of equipment for layer deposition, absorber layers having thicknesses less than 1 μm, and control of film uniformity over large areas.

SUMMARY OF THE INVENTION

In various embodiments, the present invention provides methods for fabricating a continuous film by successively printing and annealing two or more dispersions of prefabricated nanoparticles. In particular, some embodiments of the invention facilitate manufacture of graded and multifunction semiconductor films, which can be used in PV cells and other semiconductor devices. Since the method requires no vacuum, it is cheaper and more conveniently practiced than vacuum-based techniques.

Nanoparticles according to this invention are particles of specified elemental composition and no more than 100 nm, and preferably no more than 20 nm, in diameter. Typical nanoparticles include metal-oxide particles, which collectively form a powder. Some nanoparticle compositions suitable for semiconductor thin films comprise two or more of the chemical elements Cu, Ag, In, Ga, Al, Te, Se, S, Cd, and As. It should be stressed, however, that the invention is not limited to said elements, but that the method generally applies to any composition of nanoparticles suitable for dispersion, and subsequently printing. One of the advantages of techniques in accordance with the present invention lies in the ability to optimize the composition of the thin film by providing compositional control over the precursor nanoparticles. This facilitates the fabrication of a continuous film comprised of layers of specified chemical composition, which allows for the compositional optimization of these layers, and, as a result thereof, for improved control over the electric characteristics of the film and, in particular, over the variation of these characteristics throughout the thickness of the film.

Dispersions according to the invention include any (homogeneous) mixture of nanoparticles and a suitable flowable carrier comprising solvents or dispersing agents, whether the mixture is a solution, a colloid, or a suspension. These dispersions of nanoparticles are termed "printing compositions" or "nanoparticle-based inks" herein.

Methods according to the invention can be implemented using a variety of printing techniques and the corresponding printing equipment, including, but not limited to, techniques such as inkjet printing, pneumatic spray printing, screen printing, pad printing, laser printing, dot matrix printing, thermal printing lithography, or 3D printing. This versatility contributes to feasibility and cost-effectiveness. Furthermore, the composition of the nanoparticles can vary through the various deposition and annealing steps. For example, in one embodiment of the invention, the different printable compositions comprise nanoparticles of the same elements in different proportions, for example, the nanoparticles may have the formula $CuIn_{1-x}Ga_xSe_2$, wherein x varies between 0 and 1, resulting in a concentration gradient of at least one element (in the example In and Ga) through the film.

Accordingly, in a first aspect, the invention provides a method of fabricating a film, which includes the steps of providing a substrate and flowable printing compositions with different dispersions of prefabricated nanoparticles, and successively printing and annealing layers of these printing compositions into one continuous film. In some embodiments, two or more layers are successively printed before they are annealed. Further, in some embodiments an etching step precedes annealing. Some of the individual printed layers may have thicknesses smaller than 1 μm.

In certain embodiments, the printing compositions contain the same types of nanoparticles in different proportions, or nanoparticles composed of the same elements in different proportions, so that the annealed layers form a film with a concentration gradient of at least one material. In alternative embodiments, each printing composition includes different types of nanoparticles. In preferred embodiments, the nanoparticles have a size no greater than 20 nm and a low size dispersity.

In some embodiments, the film includes a semiconductor material and interacts electrically with the substrate. Moreover, this structure can be complemented by an electrically conductive superstrate to form a semiconductor device. In a particular embodiment, the device is a solar cell.

In a second aspect, the invention provides flowable printing compositions with a substantially viscosity-independent flow rate. These printing compositions contain a carrier and a dispersion of nanoparticles; the nanoparticles include Cu and/or Ag as a first component and Se, Te, and/or S as a second component. Additionally, the printing compositions may contain In, Ga, and/or Al as a third component.

It should be stressed that embodiments of methods in accordance with the invention are not limited to the printing compositions described above.

BRIEF DESCRIPTION OF THE DRAWINGS

The foregoing discussion will be understood more readily from the following detailed description of the invention when taken in conjunction with the accompanying drawings.

DETAILED DESCRIPTION OF THE INVENTION

1. Fabrication Method

Figure 1:
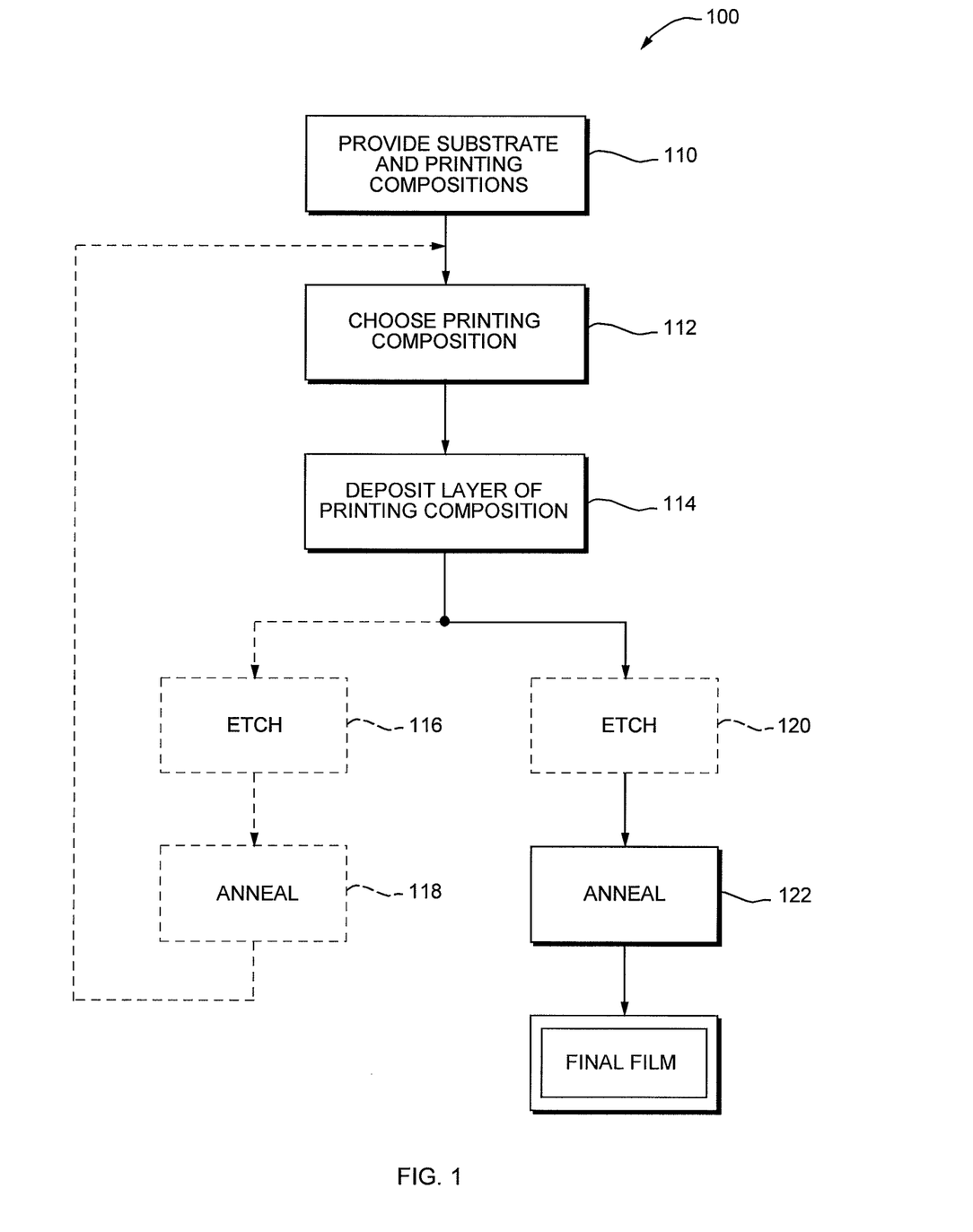
FIG. 1 is a flow diagram detailing the steps of a method to manufacture a film by successive printing and annealing.
Figure 2:
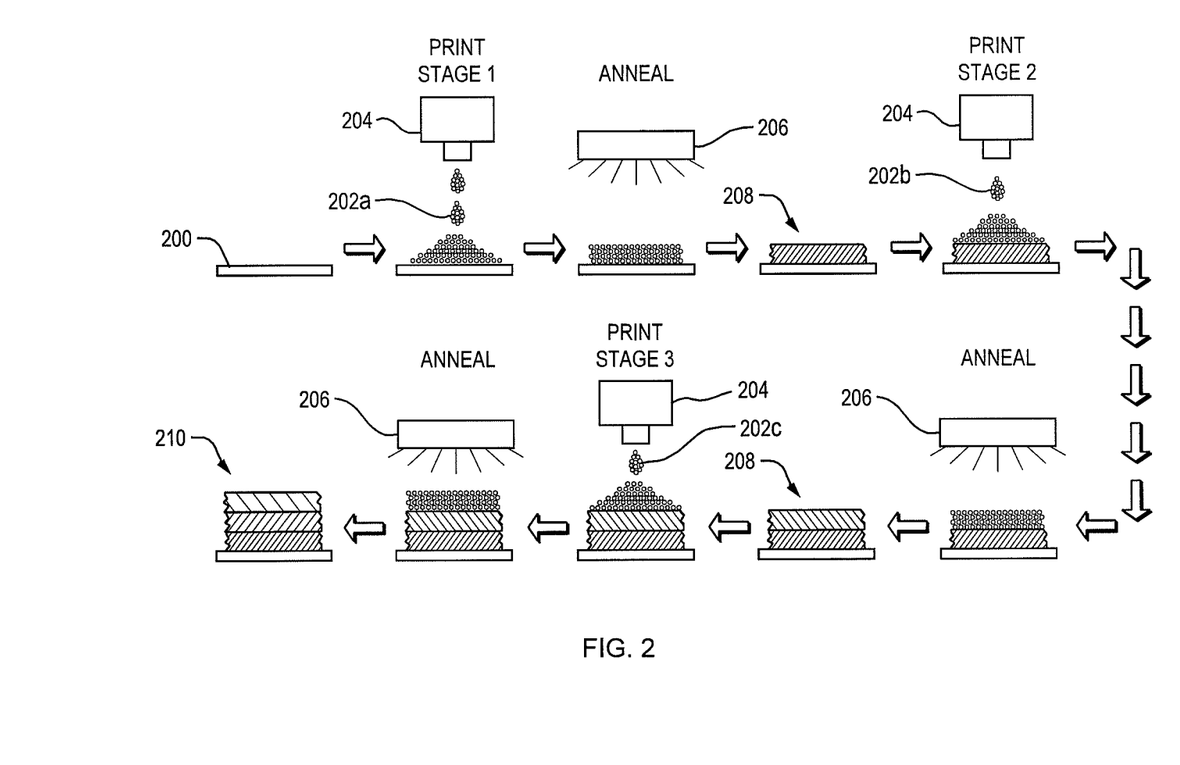
FIG. 2 schematically depicts a system and method for manufacturing the film in accordance with an embodiment of the invention.

Refer first to FIGS. 1 and 2, which illustrate, respectively, a representative process sequence 100 and operative equipment implementing embodiments of the present invention. The process sequence comprises the steps detailed in the flow diagram of FIG. 1, utilizing the equipment and resulting in the intermediate and final structures illustrated in FIG. 2. In a first step 110, a substrate 200 and a plurality of flowable printing compositions comprising different dispersions of prefabricated nanoparticles, as further described below, are provided. A printing composition 202a is selected for the first layer in step 112, and in step 114, this composition is printed onto the substrate 200 using a printer 204. In some cases, which will be described below, an etch step 116 is performed after printing. In an optional step 118, the deposited layer is dried and annealed using a heat source 206 to form a continuous film 208. By "annealing" is meant heating of a deposited layer at a sufficient temperature and for a sufficient time that the nanoparticles fuse into a continuous layer of uniform composition. Whether annealing is performed after deposition of a particular layer depends on the specifics of the printing composition, the layer thickness, and desired film characteristics. In general, however, the composition will be dried before a subsequent composition is deposited thereon. Annealing source 206 may be any suitable heat source, e.g., an oven, vacuum oven, furnace, IR lamp, laser, or hot plate, and suitable annealing times and temperatures, which depend on nanoparticle size and composition as well as ink composition, may be obtained without undue experimentation by means of calibration as described below in the context of printing equipment. Anneal temperatures are generally above 200° C.

The steps 112, 114, and optionally steps 116, 118, are repeated to print a second printing composition 202b, which generally differs from the composition 202a, resulting in a film 208 that now contains two layers. This repetition may involve the same printing and annealing equipment 204, 206, in which case the new printing composition is substituted (e.g., in the form of a cartridge) in printer 204. Alternatively, the process sequence 100 may be carried out in a assembly-line configuration with separate printing and annealing equipment dedicated to each deposition and annealing step. Utilizing the same equipment for multiple steps may be more practical where numerous films are fabricated in parallel (i.e., the same steps are simultaneously performed on multiple substrates); while a line configuration may be preferred where individual substrates 200 are processed serially.

Steps 110-118 may (but need not) be repeated a plurality of times to form a film having three or more layers 202a, 202b, 202c. Once again, a particular printing composition can be utilized once or more than once, although in the case of graded films, the composition will change progressively with each deposition step. After the last layer has been printed, an etching step 120 is again optional, but a final annealing step 122 must take place, whether previous anneals 116 have been performed or not, to form a continuous final film 210 from the deposited layers. The number of layers deposited and annealed in this way is at least two, and is limited only by the desired thickness and composition of the final film 210. Accordingly, while FIG. 2 illustrates the manufacturing of a film with three layers, this is merely for illustration.

Each layer may contain a single type of nanoparticle, in which case different layers typically contain nanoparticles having different chemical compositions; or alternatively (or in addition), each layer may contain a plurality of nanoparticle types, in which case the same set of nanoparticles may be used in different proportions in the different layers. In some embodiments of the invention, the method 100 is employed to produce a high-efficiency graded film by using a variety of printing compositions with nanoparticles comprising the same elements, but in different proportions. For example, a CIGS film may be produced with the varying chemical composition $CuIn_{1-x}Ga_xSe_2$, where x varies progressively among successively deposited layers (i.e., successive printing compositions). For example, x may be the distance of a certain location within the film from a boundary surface of the film (e.g., the top surface of the structure or the boundary surface in contact with the substrate), divided by the thickness of the film. Such films have been manufactured by means of chemical vapor deposition (CVD) and used as the absorption layer in a PV cell with the gallium concentration increasing towards a molybdenum back contact, resulting in a particularly high efficiency of 19.5%—a consequence of reduced back-surface recombination due to the quasi-electric field established by the concentration and corresponding bandgap gradient. The method 100 provides an alternative to the CVD process: using a suitable substrate, such as Mo-covered glass, $CuInSe_2$ may be deposited for the first layer, followed by printing compositions in which the Ga content is progressively (in a linear or nonlinear fashion) increased in each layer, until the composition of the nanoparticles is primarily $CuGaSe_2$. Once the layers are printed in the desired sequence, they are annealed to form a high-performance graded CIGS film. Other nanoparticle-based inks may also be introduced as intermediate layers to further tune the band structure of the material in order to optimize the performance of the cell. Techniques in accordance with the present invention offer the additional advantage, compared with CVD, of avoiding the need for vacuum equipment.

In other embodiments of the invention, the printing compositions comprise different types of nanoparticles. The method 100 can, for instance, be used to manufacture a CdS/CdTe thin film. In general, the approach of the invention can be applied to any material for which a suitable nanoparticle source is available.

2. Printing Equipment 204

For the implementation of the printing step 114, a variety of well-characterized printing processes can be used to advantage, including, but not limited to, inkjet printing, pneumatic spraying, screen printing, pad printing, laser printing, dot matrix printing, thermal printing, lithography, and 3D printing. Computer-controlled inkjet printers are readily available and particularly attractive for practice of the invention because of the level of control they provide. A commercially available inkjet printer can be used with little or no modification to print nanoparticle-based inks (the printing compositions) as described herein. To avoid problems such as clogging of the printer head or other incompatibilities, the viscosities of nanoparticle-based inks can be adjusted to those of inks produced by the printer's manufacturer, as detailed below in the context of printing compositions. The amenability of the method 100 to readily available, low-cost equipment, such as inkjet printers, constitutes one of its advantages.

To facilitate control over the thicknesses of the individual layers and the film as a whole, the printer can be calibrated as follows. For each printing composition, a sequence of print runs is carried out, each print run involving a different number of printing passes. Drying and annealing are performed after each printing pass or at the end of a run. The thickness of the film resulting from each of the runs is different, and is determined via scanning electron microscopy (SEM) or transmission electron microscopy (TEM), or any other suitable technique. As a result, a layer having a desired thickness may be made by reference to the number of printing passes corresponding to that thickness. Similar calibration techniques can be used to determine optimal annealing temperatures and times for desired film properties.

3. Printing Compositions 202

Printing compositions in accordance herewith are flowable dispersions of nanoparticles. Particulate precursor materials simplify compositional control for multi-component materials such as, for example, CIGS, since key components (e.g., Cu, In, Ga) can be precisely mixed in the precursor powders. One method of fabricating these powders involves mixing the constituent elements at the required ratios, dissolving them in acid to form an aqueous mixture, using hydroxide precipitation to form a gelatinous mixture of hydroxides of the elements, and drying the mixture to obtain a fine powder of mixed oxides. Nanoparticle synthesis can also be carried out using techniques described, for example, in U.S. Pat. No. 6,379,635 and co-pending U.S. patent application Ser. Nos. 11/579,050 and 11/588,880, the entire disclosures of which are hereby incorporated by reference.

A method for producing CIGS nanoparticles of any desirable stoichiometry employing a selenol compound is disclosed in U.S. Provisional Application Ser. No. 60/991,510. Embodiments of the method involve dispersing at least a first portion of a nanoparticle precursor composition (comprising sources of at least one of Al, Ga, and/or In, and at least one of Cu, Ag, Zn, and/or Cd) in a solvent (e.g., a long-chain hydrocarbon solvent); heating the solvent to a first temperature for an appropriate length of time; adding a selenol compound to the solvent and heating the solvent; adding a second portion of the nanoparticle precursor composition to the reaction mixture; heating the mixture to a second temperature higher than the first temperature over an appropriate length of time; and maintaining the temperature for up to 10 hours. Once the particles have been formed, the surface atoms of the particles will typically be coordinated to a capping agent, which can comprise the selenol compound employed in the method. If a volatile selenol compound is used, this capping agent can be driven off with heating to yield 'naked' nanoparticles amenable to capping with other coordinating ligands and further processing. Examples 1 and 2 provide further details regarding the implementation of this method:

Example 1

Cu(I) acetate (1 mmol) and In(III) acetate (1 mmol) are added to a clean and dry RB-flask. Octadecene ODE (5 mL) is added the reaction mixture heated at 100° C. under vacuum for 30 mins. The flask is back-filled with nitrogen and the temperature raised to 140° C. 1-octane selenol is injected and the temperature falls to 120° C. The resulting orange suspension is heated with stirring and a transparent orange/red solution is obtained when the temperature has reached 140° C. This temperature is maintained for 30 minutes, then 1M trioctyl-phoshine selenide TOPSe (2 mL, 2 mmol) is added dropwise and the solution heated at 160° C. The PL is monitored until it reaches the desired wavelength, after which it is cooled and the resulting oil washed with methanol/acetone (2:1) 4-5 times and finally isolated by precipitation with acetone.

Example 2

Large Scale Production

A stock solution of TOPSe was prepared by dissolving Se powder (10.9, 138 mmol) in TOP (60 mL) under nitrogen. To dry, degassed ODE was added Cu(I) acetate (7.89 g, 64.4 mmol) and In(III) acetate (20.0 g, 68.5 mmol). The reaction vessel was evacuated and heated at 140° C. for 10 min, back-filled with $N_2$ and cooled to room temp. 1-Octane selenol (200 mL) was added to produce a bright orange suspension. The temperature of the flask was raised to 140° C. and acetic acid distilled from the reaction at 120° C. On reaching 140° C. the TOPSe solution was added dropwise over the course of 1 hour. After 3 hours the temperature was raised to 160° C. The progress of the reaction was monitored by taking aliquots from the reaction periodically and measuring the UV/Visible and photoluminescence spectra. After 7 hours the reaction was cooled to room temperature and the resulting black oil washed with methanol. Methanol washing was continued until it was possible to precipitate a fine black material from the oil by addition of acetone. The black precipitate was isolated by centrifugation, washed with acetone and dried under vacuum. Yield: 31.97 g.

To optimize particle properties or the selection of suitable dispersants, the nanoparticles can be characterized with respect to their composition, size, and charge by conventional techniques including x-ray diffraction (XRD), UV/Vis/Near-IR spectrometry, scanning or transmission electron microscopy (SEM/TEM), energy dispersive x-ray microanalysis (EDAX), photoluminescence spectrometry, and/or elemental analysis. Inductively coupled plasma atomic-emission spectroscopy (ICPAES) analysis of representative Cu/In/Se core particles, prepared in a 1-octane selenol capping agent which was subsequently removed, provided the following suitable nanoparticle composition: Cu 16.6%; In 36.6%; Se 48.3%, corresponding to $Cu_{1.00}$, $In_{1.22}$, $Se_{2.34}$, and a Cu/In ratio of 0.82.

In preferred embodiments of this invention, the nanoparticles have average sizes not greater than 20 nm, and low size dispersities of around ±2 nm or less. Conformance to these constraints facilitates printing of thin films with control over the band structure through the film, resulting in high conversion efficiencies. Moreover, low size dispersities allow for good packing of the nanoparticles, and uniform melting temperature of the nanoparticle films, which contributes to proper film formation.

The nanoparticles are dispersed in a carrier comprising solvents, such as toluene, and dispersing agents to form the printing composition. The dispersion may take the form of a solution, colloid, or suspension, generally depending on the particle size, and may have the consistency of a liquid, paste, or other viscoelastic material, as long as it is flowable. Its viscosity should be within the range from $0.158 \times 10^{11}$ cP to $2.3 \times 10^{11}$ cP.

In embodiments in which water-based inks are formed with non-soluble nanoparticles, surface area and charge of the particles drive the selection of dispersants suitable for ink formulation. For example, in pigment-based inkjet printing, the overall charge the particles acquire (i.e., the zeta potential) in the medium in which they are dispersed should be sufficiently high to ensure dispersion stability; but excessive dispersion stability can result in flocculation and consequent clogging of the printer head. To ensure the jetting potential of the ink through the nozzle, the average agglomerate size should be minimized. In the printing industry, it is generally recognized that particle sizes of over 500 nm may cause plugging of the inkjet nozzles, compromising print quality.

To mitigate print-head blocking concerns, nanoparticles can be coated in water-solubilizing capping agents, such as a mercaptocarboxylic acid (e.g., mercaptoacetic acid). For example, U.S. Pat. No. 6,114,038, the entire disclosure of which is hereby incorporated by reference, teaches how to exchange the coating groups of water-insoluble, pyridine-capped nanocrystals with a large excess of neat mercaptocarboxylic acid to obtain water-soluble capped nanocrystals. In brief, the pyridine-capped nanocrystals are precipitated with hexanes and centrifuged; the residue is dissolved in neat mercaptoacetic acid and incubated at room temperature for at least six hours; chloroform is added to precipitate the nanocrystals and wash away excess thiol; and the nanocrystals are again centrifuged, washed with chloroform and hexane, and dried with argon. The viscosity of the printing composition (nanoparticle-based ink) is desirably adjusted to achieve plastic flow behavior, i.e., where viscosity is essentially independent of flow rate. This facilitates control over coating characteristics. Capping agents needed for solubilization or suspension can be removed to stop the formation of carbon deposits within the film. In some cases, this removal occurs naturally as a result of annealing at elevated temperatures, but if does not, it can be aided by a prior etching step 116, 120.

4. Applications

Figure 3A:
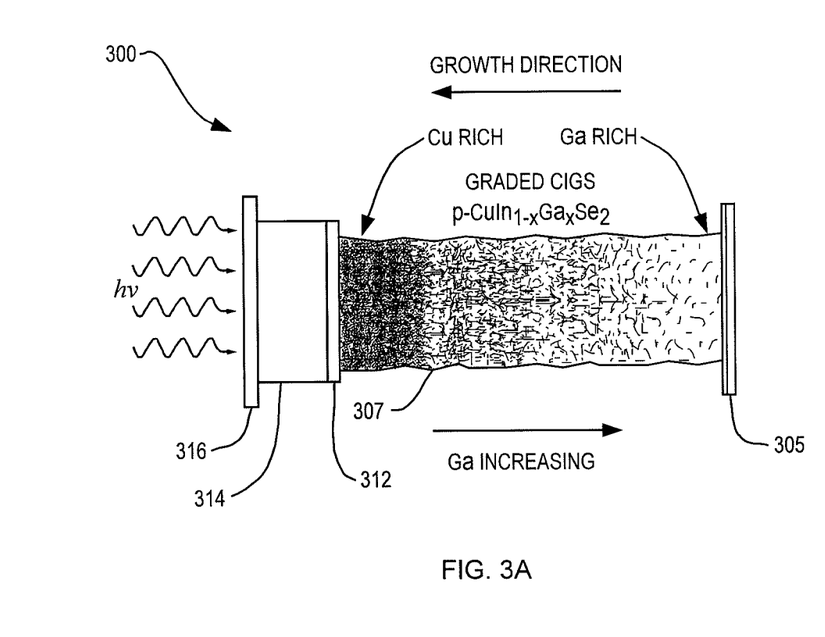
FIG. 3A is a schematic elevational view of a representative solar cell manufactured in accordance with the invention.
Figure 3B:
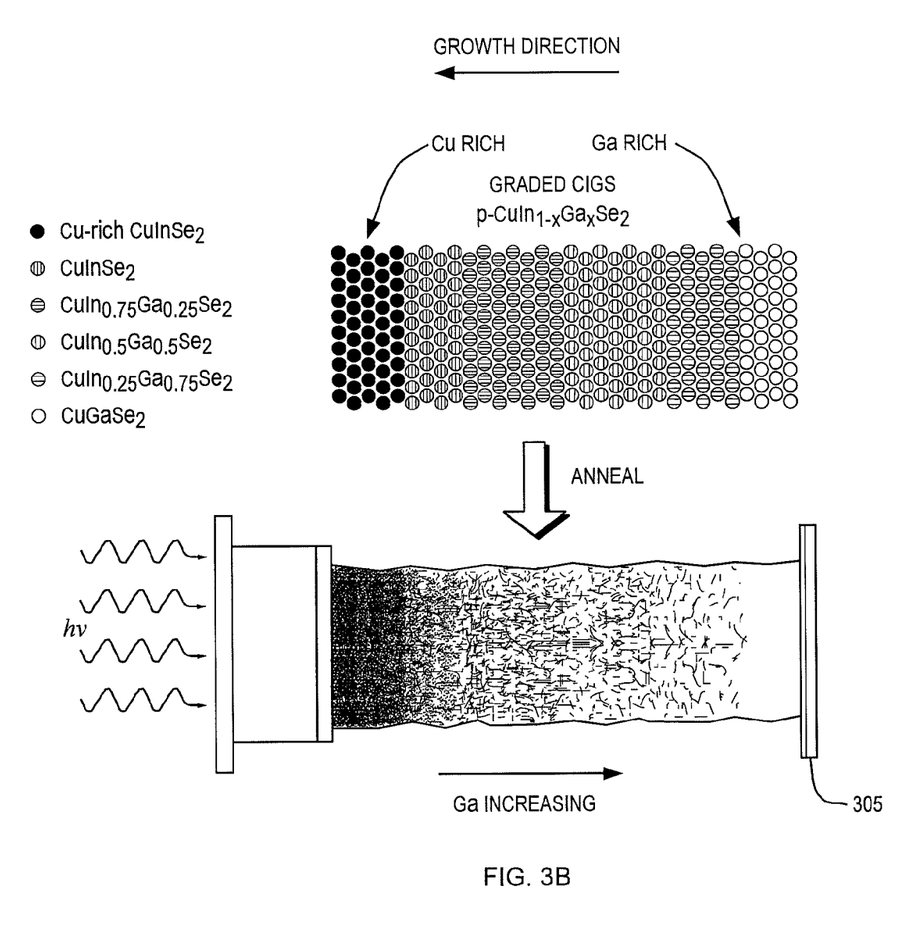
FIG. 3B is a schematic elevational view of a graded CIGS film, manufactured by first depositing all constituting layers and then annealing once to produce a continuous film, and of a solar cell made therefrom.

Semiconductor thin-film structures manufactured according to the method illustrated in FIG. 1 can be used in photovoltaic cells, LEDs, transistors, and other semiconductor devices. FIG. 3A illustrates a representative structure of a solar cell with a CIGS absorber film. The substrate 305 comprises molybdenum on glass, and the submicron Mo layer also provides the back contact of the cell 300. The absorber film 307 comprises a series of annealed layers of CIGS, and exhibits increasing Ga and decreasing In concentration towards the Mo contact 300. This film can be manufactured by printing and annealing each layer consecutively. Alternatively, as illustrated in FIG. 3B, which exemplifies the In and Ga contents of individual layers, it can be manufactured by first depositing all the layers, and subsequently fusing these layers into one continuous film in one annealing step. A buffer layer 312 forms the junction with the CIGS film. Conventionally, this junction comprises CdS. However, due to environmental and health concerns associated with Cd, preferred PV cells are cadmium-free, using ZnS, ZnO(O, OH), or $In_2S_3$ instead. Accordingly, a ZnO layer 314 over a glass cover 316 provides the superstrate of the cell 300. The performance of a ZnO/ZnO(O, OH)/CIGS/Mo cell can be improved or optimized by introducing layers of other semiconductor materials within the absorber film 307. CIGS variants (e.g., as shown in the following Table 1) in which Se is replaced by S or Te, Cu by Ag, or In or Ga by Al, for example, can be used to manipulate the energies of the valence and conduction bands to aid in electron-hole capture. Embodiments of the invention provide a convenient means to integrate these additional layers. Moreover, if nanoparticle sources are available for the junction layer and/or the substrate or superstrate, these layers can likewise be integrated into the device by printing and annealing, as long as none of the required annealing temperatures is detrimental to the other layers within the device.

TABLE 1

| Low Bandgap | | High Bandgap | |
|---|---|---|---|
| Material | $E_g$ (eV) | Material | $E_g$ (eV) |
| $CuInSe_2$ | 1.0 | $CuAlSe_2$ | 2.71 |
| $CuInTe_2$ | 1.0-1.15 | $CuInS_2$ | 1.53 |
| $CuGaTe_2$ | 1.23 | $CuAlTe_2$ | 2.06 |
| | | $CuGaSe_2$ | 1.70 |
| | | $CuGaS_2$ | 2.50 |
| $AgInSe_2$ | 1.20 | $AgGaSe_2$ | 1.80 |
| $AgGaTe_2$ | 1.1-1.3 | $AgAlSe_2$ | 1.66 |
| $AgAlTe_2$ | 0.56 | $AgInS_2$ | 1.80 |
| | | $AgGaSe_2$ | 1.80 |
| | | $AgGaS_2$ | 2.55 |
| | | $AgAlS_2$ | 3.13 |

Although the present invention has been described with reference to specific details, it is not intended that such details should be regarded as limitations upon the scope of the invention, except as and to the extent that they are included in the accompanying claims.

What is claimed is:

1. A method of fabricating a contiguous multi-layer photo-absorptive CIGS film, the method comprising the steps of:
   a. providing a substrate and a plurality of flowable printing compositions each comprising a different dispersion of prefabricated compound semiconductor nanoparticles of specific elemental compositions and having an average size no greater than 100 nm, the nanoparticles comprising $CuIn_{1-x}Ga_xSe_2$;
   b. printing a layer of one of the printing compositions onto the substrate;
   c. annealing the printed layer to form a continuous absorptive CIGS layer of the corresponding nanoparticles' specific elemental compositions; and
   d. repeating steps (b) and (c) with another or the same printing composition to form the contiguous multi-layer photo-absorptive CIGS film.

2. The method of claim 1, wherein at least some of the printed layers have a thickness smaller than 1 μm.

3. The method of claim 1 further comprising repeating step (b) at least once before step (c).

4. The method of claim 1 further comprising the step of performing an etch after printing and before annealing.

5. The method of claim 1 wherein the printing compositions are suspensions.

6. The method of claim 1 wherein the printing compositions are solutions.

7. The method of claim 1 wherein the printing step is performed by a printing technique selected from the group consisting of inkjet printing, pneumatic spraying, screen printing, pad printing, laser printing, dot matrix printing, thermal printing, lithography, or 3D printing.

8. The method of claim 1 wherein at least some of the printing compositions contain the same types of nanoparticles in different proportions, the layers being applied to create a concentration gradient of at least one material through the film.

9. The method of claim 1 wherein x varies through the printing compositions, thereby creating concentration gradients of In and Ga through the film.

10. The method of claim 1 wherein each printing composition comprises different types of nanoparticles.

11. The method of claim 1 wherein the nanoparticles have a size no greater than 20 nm and a low size dispersity.

12. The method of claim 1 wherein the thin film interacts electrically with the substrate.

13. The method of claim 12 further comprising adding an electrically conductive superstrate and external contacts to produce a semiconductor device.

14. The method of claim 13, wherein the semiconductor device is a solar cell.

15. A method of fabricating a multi-layer compound semiconductor film, the method comprising the steps of:
   a. providing a substrate and a plurality of flowable printing compositions each comprising a different dispersion of prefabricated compound semiconductor nanoparticles of specific elemental compositions and having an average size no greater than 100 nm, the nanoparticles of each composition comprising the same elements in different proportions;
   b. printing a layer of one of the printing compositions onto the substrate;
   c. annealing the printed layer to form a continuous layer of the corresponding nanoparticles' specific elemental compositions; and
   d. repeating steps (b) and (c) with another or the same printing composition to form the multi-layer film, wherein the layers are applied to create a concentration gradient of at least one material through the multi-layer film.

* * * * *